United States Patent
Kwon

(10) Patent No.: US 11,600,607 B2
(45) Date of Patent: Mar. 7, 2023

(54) SEMICONDUCTOR MODULE INCLUDING MULTIPLE POWER MANAGEMENT SEMICONDUCTOR PACKAGES

(71) Applicant: Samsung Electronics Co., Ltd., Suwon-si (KR)

(72) Inventor: Heungkyu Kwon, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 445 days.

(21) Appl. No.: 16/744,437

(22) Filed: Jan. 16, 2020

(65) Prior Publication Data

US 2020/0235083 A1  Jul. 23, 2020

(30) Foreign Application Priority Data

Jan. 17, 2019  (KR) .................. 10-2019-0006352
Dec. 11, 2019  (KR) .................. 10-2019-0164789

(51) Int. Cl.
*H01L 25/16* (2006.01)
*H01L 23/538* (2006.01)
*H01L 23/498* (2006.01)
*H01L 23/367* (2006.01)

(52) U.S. Cl.
CPC ........ *H01L 25/162* (2013.01); *H01L 23/3675* (2013.01); *H01L 23/49816* (2013.01); *H01L 23/5385* (2013.01); *H01L 23/5386* (2013.01)

(58) Field of Classification Search
CPC ........... H01L 23/3675; H01L 23/49816; H01L 23/42; H01L 23/36; H01L 25/162; H01L 23/5386; H01L 23/5385; H01L 25/03; H01L 25/0652; H01L 2225/06513; H01L 2924/19106; H01L 2225/06541; H01L 2924/15311; H01L 2924/19105; H01L 2224/16227; H01L 2225/06517; H01L 25/16; H01L 23/538; H01L 23/367; H01L 23/498
USPC ................................................. 257/669, 668
See application file for complete search history.

(56) References Cited

U.S. PATENT DOCUMENTS

| | | |
|---|---|---|
| 6,222,259 B1 | 4/2001 | Park et al. |
| 7,250,676 B2 | 7/2007 | Wang |
| 8,541,876 B2 | 9/2013 | Lu et al. |
| 8,780,561 B2 | 7/2014 | Danello et al. |
| 8,981,554 B2 | 3/2015 | Kim |

(Continued)

FOREIGN PATENT DOCUMENTS

| | | | | |
|---|---|---|---|---|
| CN | 110473839 A | * | 11/2019 | ........... H01L 23/367 |
| EP | 3410481 A1 | * | 5/2018 | ............. H01L 25/11 |

(Continued)

*Primary Examiner* — Alexander O Williams
(74) *Attorney, Agent, or Firm* — Harness, Dickey & Pierce, P.L.C.

(57) ABSTRACT

A semiconductor module may include a system board including a top surface and a bottom surface, a module substrate provided on the top surface of the system board, a system semiconductor package mounted on the module substrate, and first and second power management semiconductor packages mounted on the module substrate. The first and second power management semiconductor packages may be spaced apart from each other in a first direction, which is parallel to a top surface of the module substrate, with the system semiconductor package interposed therebetween.

20 Claims, 15 Drawing Sheets

(56) References Cited

U.S. PATENT DOCUMENTS

| | | |
|---|---|---|
| 9,406,648 B2 | 8/2016 | Wang et al. |
| 9,460,982 B2 | 10/2016 | Kourakata et al. |
| 9,536,805 B2 | 1/2017 | Fazelpour et al. |
| 9,595,506 B2 | 3/2017 | Chen et al. |
| 9,595,514 B2 | 3/2017 | Bruno et al. |
| 9,735,082 B2 | 8/2017 | Hung et al. |
| 9,839,127 B2 | 12/2017 | Kwon et al. |
| 10,025,354 B2 | 7/2018 | Kwon |
| 2002/0121683 A1 | 9/2002 | Kelly et al. |
| 2005/0189634 A1 | 9/2005 | Wakiyama et al. |
| 2012/0051017 A1 | 3/2012 | Lee et al. |
| 2015/0162307 A1* | 6/2015 | Chen .............. H01L 23/367 438/107 |
| 2016/0120039 A1 | 4/2016 | Bang et al. |
| 2016/0320426 A1 | 11/2016 | Boysel et al. |
| 2017/0141095 A1 | 5/2017 | Bruno et al. |
| 2017/0170147 A1 | 6/2017 | Goh et al. |
| 2017/0236809 A1 | 8/2017 | Trimberger et al. |
| 2018/0190635 A1 | 7/2018 | Choi et al. |
| 2019/0043835 A1* | 2/2019 | Lee .............. H01L 25/0657 |
| 2019/0043847 A1* | 2/2019 | Lee .............. H01L 23/5385 |
| 2019/0244905 A1* | 8/2019 | Yu .............. H01L 24/19 |
| 2020/0212018 A1* | 7/2020 | Lai .............. H01L 23/3121 |
| 2020/0294917 A1* | 9/2020 | Lee .............. H01L 24/19 |
| 2021/0175177 A1* | 6/2021 | Kim .............. H01L 21/568 |

FOREIGN PATENT DOCUMENTS

| | | | |
|---|---|---|---|
| EP | 3567628 A1 * | 3/2019 | ............ H01L 23/42 |
| JP | 3573135 B2 | 10/2004 | |
| JP | 2008305838 A | 12/2008 | |
| JP | 5246133 B2 | 7/2013 | |
| JP | 2014154688 A | 8/2014 | |
| KR | 20-2000-0019563 U | 11/2000 | |
| KR | 10-2016-0091084 A | 8/2016 | |
| KR | 20180079007 A * | 7/2018 | ........ H01L 12/5383 |
| KR | 10-2019-0129665 A | 11/2019 | |
| KR | 10-2019-0130444 A | 11/2019 | |
| KR | 10-2019-0130954 A | 11/2019 | |
| KR | 10-2020-0033131 A | 3/2020 | |
| KR | 10-2020-0090080 A | 7/2020 | |
| WO | WO-9916128 A1 | 4/1999 | |

\* cited by examiner

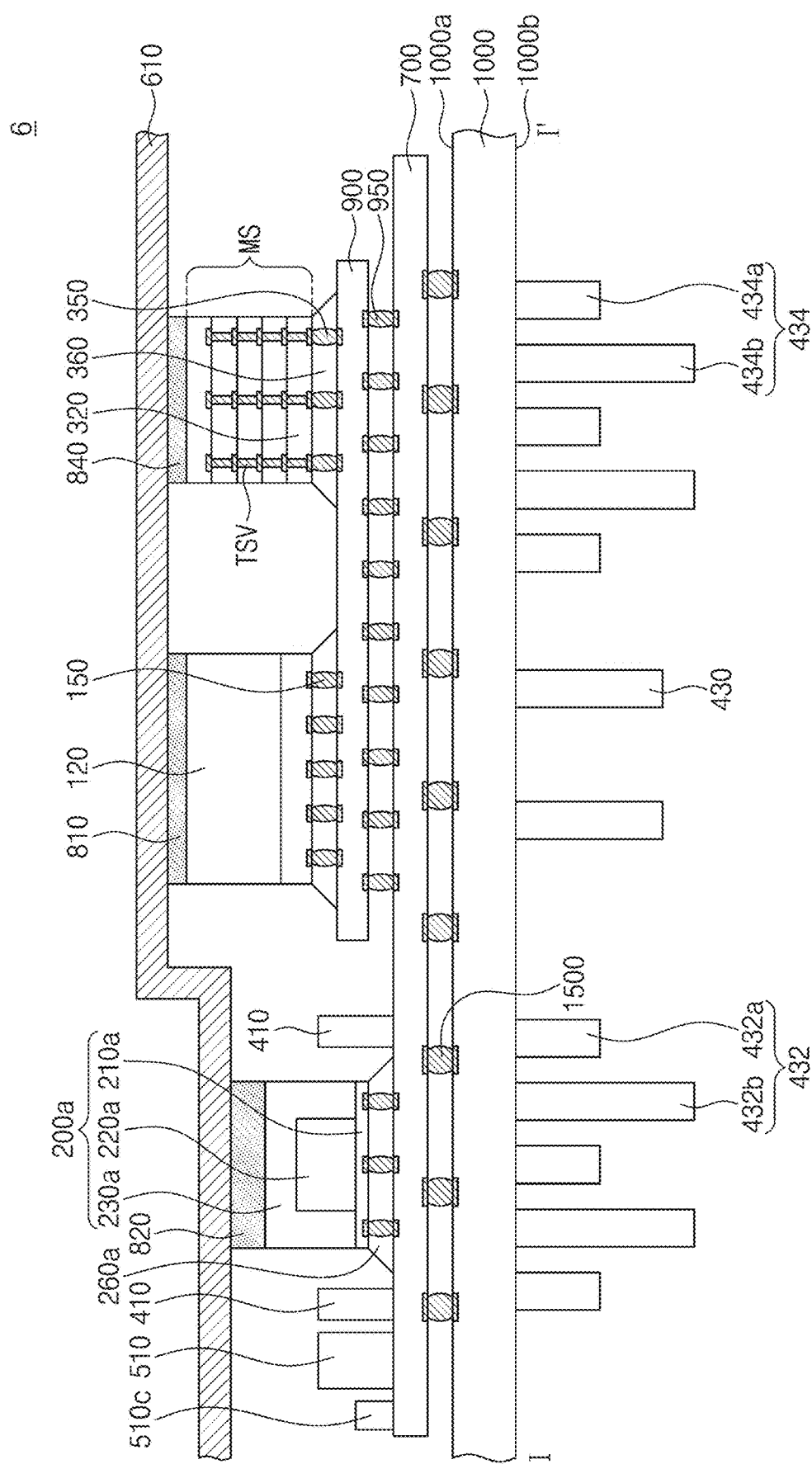

SEMICONDUCTOR MODULE INCLUDING MULTIPLE POWER MANAGEMENT SEMICONDUCTOR PACKAGES

CROSS-REFERENCE TO RELATED APPLICATIONS

This U.S. non-provisional patent application claims priority under 35 U.S.C. § 119 to Korean Patent Application No. 10-2019-0006352, filed on Jan. 17, 2019, and Korean Patent Application No. 10-2019-0164789, filed on Dec. 11, 2019, in the Korean Intellectual Property Office, the entire contents of each of which are hereby incorporated by reference.

BACKGROUND

Example embodiments relate to a semiconductor module, and in particular, to a semiconductor module with a power management integrated circuit (PMIC).

A semiconductor package is configured to allow a semiconductor chip to be easily used as a part of an electronic product. The semiconductor package may include a printed circuit board (PCB) and a semiconductor chip, which is mounted on the PCB and is electrically connected to the PCB using bonding wires or bumps. Conventionally, a single power management chip may supply electric power to the semiconductor chip via the PCB.

As the operation speed and capacity of the semiconductor package increase, the power consumption of the semiconductor package may increase. Accordingly, it is important to stably supply an electric power to the semiconductor package.

SUMMARY

Example embodiments of the inventive concepts provide a semiconductor module capable of stably supplying an electric power to a system semiconductor package.

According to an example embodiment of the inventive concepts, a semiconductor module may include a system board including a top surface and a bottom surface; a module substrate on the top surface of the system board; a system semiconductor package on the module substrate; and a pair of power management semiconductor packages on the module substrate, the pair of power management semiconductor packages including a first power management semiconductor package and a second power management semiconductor package spaced apart from the first power management semiconductor package in a first direction with the system semiconductor package interposed therebetween, the first direction being parallel to a top surface of the module substrate.

According to an example embodiment of the inventive concepts, a semiconductor module may include a system board; a system semiconductor package on the system board, the system semiconductor package including a system-on-chip; a pair of power management semiconductor packages on the system board, the pair of power management semiconductor packages including a first power management semiconductor package and a second power management semiconductor package; first wires disposed across a first side surface of the system semiconductor package, when viewed in a plan view, the first power management semiconductor package being electrically connected to the system semiconductor package via the first wires; and second wires disposed across a second side surface of the system semiconductor package, the second power management semiconductor package being electrically connected to the system semiconductor package through the second wires, the second side surface being opposite to the first side surface, wherein the first wires and the second wires extend in different directions from the system semiconductor package.

According to an example embodiment of the inventive concepts, a semiconductor module may include a system board; a module substrate on the system board; a pair of power management semiconductor packages on a top surface of the module substrate, the pair of power management semiconductor packages being spaced apart in a first direction parallel to the top surface of the module substrate; an interposer between the pair of power management semiconductor packages; and a system-on-chip and a memory chip stack on the interposer, the system-on-chip being between the pair of power management semiconductor packages, when viewed in a plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6B is a sectional view taken along line III-III' of FIG. 6A.

It should be noted that these figures are intended to illustrate the general characteristics of methods, structure and/or materials utilized in certain example embodiments and to supplement the written description provided below.

These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1A:
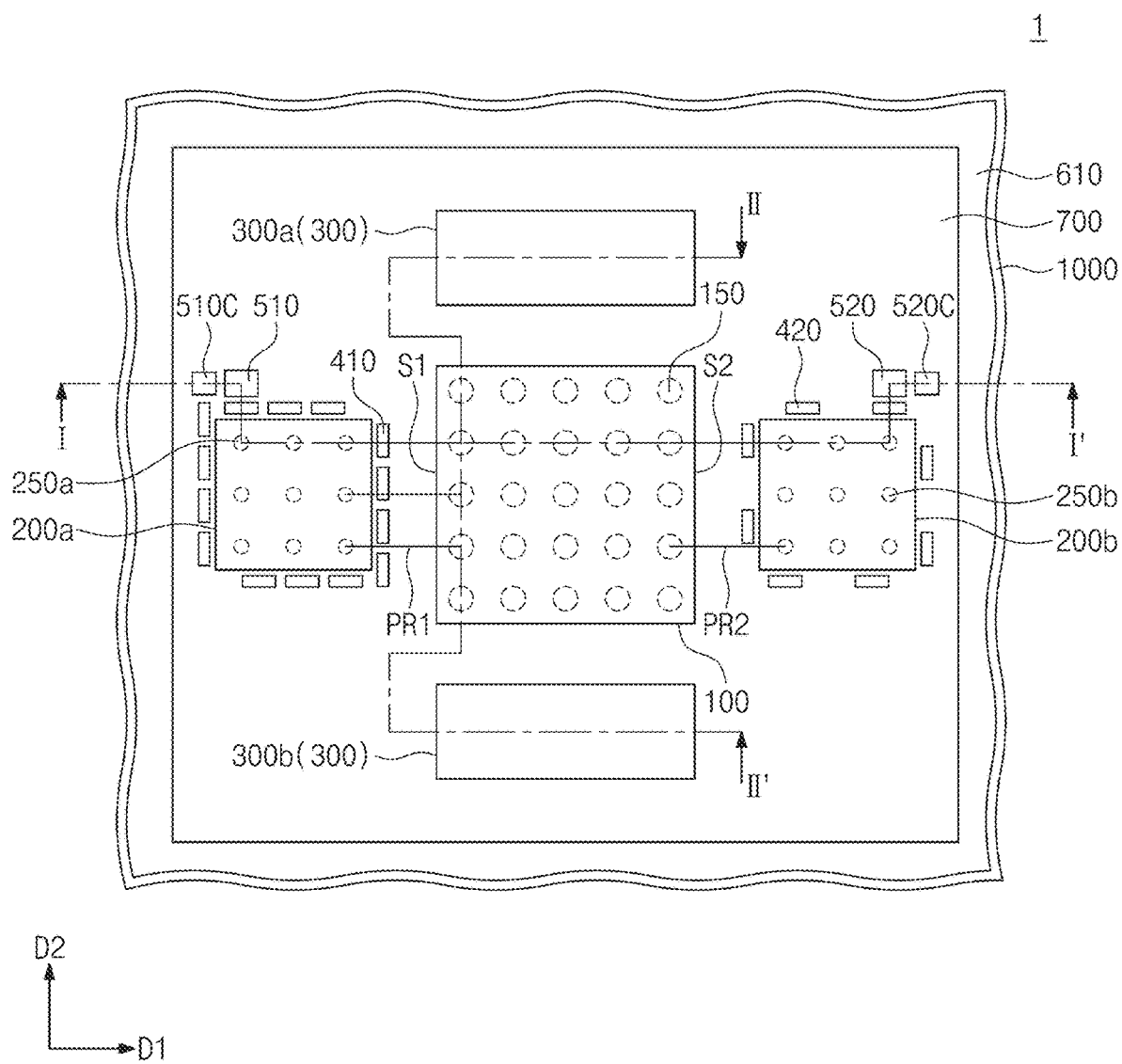
FIG. 1A is a plan view illustrating a semiconductor module according to an example embodiment of the inventive concepts.
Figure 1B:
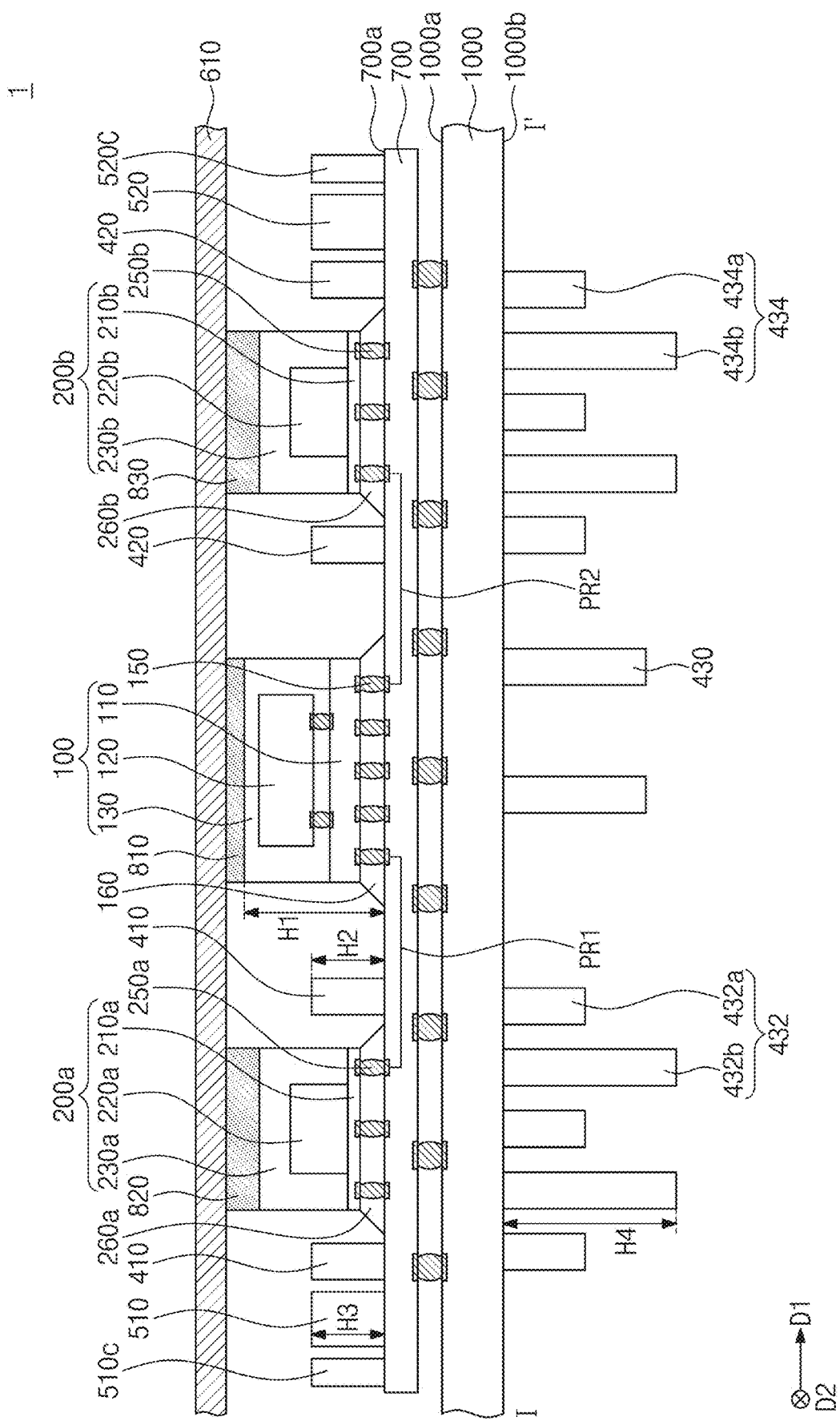
FIG. 1B is a sectional view taken along line I-I' of FIG. 1A.
Figure 1C:
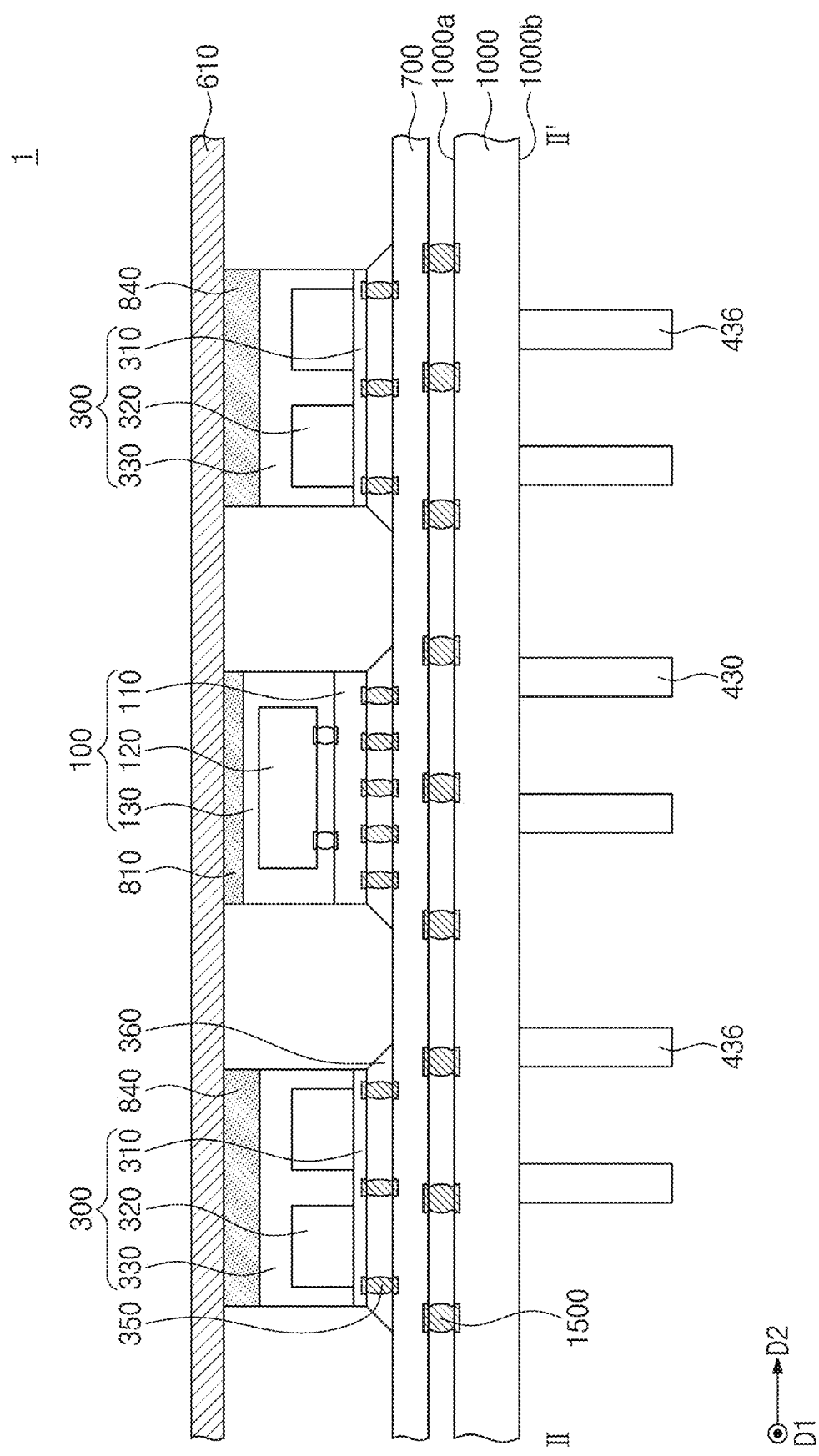
FIG. 1C is a sectional view taken along line II-II' of FIG. 1A.

FIG. 1A is a plan view illustrating a semiconductor module according to an example embodiment of the inventive concepts. FIG. 1B is a sectional view taken along line I-I' of FIG. 1A. FIG. 1C is a sectional view taken along line II-II' of FIG. 1A. In order to reduce complexity in the drawings and to provide better understanding of an example embodiment of the inventive concepts, some elements shown in FIGS. 1B and 1C are omitted from FIG. 1A.

Referring to FIGS. 1A, 1B, and 1C, a semiconductor module 1 may include a system board 1000, a module substrate 700, a system semiconductor package 100, a first power management semiconductor package 200a, a second power management semiconductor package 200b, and a plurality of memory semiconductor packages 300.

The system board 1000 may be, for example, a printed circuit board (PCB) with circuit patterns.

The module substrate 700 may be disposed on a top surface 1000a of the system board 1000. The module substrate 700 may be, for example, a printed circuit board (PCB) with circuit patterns.

Conductive terminals 1500 may be provided between the system board 1000 and the module substrate 700. The module substrate 700 may be electrically connected to the system board 1000 through the conductive terminals 1500. The conductive terminals 1500 may include at least one of solder balls, bumps, and pillars. The conductive terminals 1500 may be formed of or include, for example, a metallic material.

The system semiconductor package 100, the first power management semiconductor package 200a, the second power management semiconductor package 200b, and the memory semiconductor packages 300 may be mounted on a top surface 700a of the module substrate 700.

The first power management semiconductor package 200a and the second power management semiconductor package 200b may be spaced apart from each other in a first direction D1, which is parallel to the top surface 700a of the module substrate 700, with the system semiconductor package 100 interposed therebetween.

The first power management semiconductor package 200a may be electrically connected to the system semiconductor package 100 through a plurality of first wires PR1. The second power management semiconductor package 200b may be electrically connected to the system semiconductor package 100 through a plurality of second wires PR2.

When viewed in a plan view, the first wires PR1 may be provided across a first side surface S1 of the system semiconductor package 100. The second wires PR2 may be provided across a second side surface S2, which is opposite to the first side surface S1 of the system semiconductor package 100.

Accordingly, lengths of electrical signal paths between the semiconductor packages 100, 200a, 200b, and 300 may be reduced, and this make it possible to improve operation characteristics (e.g., operation speed and reliability) of the semiconductor module 1.

The first power management semiconductor package 200a may supply an electric power to the system semiconductor package 100 through the first wires PR1. The second power management semiconductor package 200b may supply an electric power to the system semiconductor package 100 through the second wires PR2. The first wires PR1 and the second wires PR2 may correspond to power rails.

The number of the first wires PR1 may be different from the number of the second wires PR2. As an example, the number of the first wires PR1 may be greater than the number of the second wires PR2. In the case where the number of the first wires PR1 is greater than the number of the second wires PR2, an intensity of electric signal (e.g., amount of electric power), which is supplied from the first power management semiconductor package 200a to the system semiconductor package 100, may be greater than an intensity of electric signal (e.g., amount of electric power), which is supplied from the second power management semiconductor package 200b to the system semiconductor package 100.

The memory semiconductor packages 300 may be spaced apart from each other with the system semiconductor package 100 interposed therebetween. For example, the memory semiconductor packages 300 may include a first memory semiconductor package 300a and a second memory semiconductor package 300b, and the first and second memory semiconductor packages 300a and 300b may be arranged in a second direction D2, which is parallel to the top surface 700a of the module substrate 700 and is non-parallel (e.g., orthogonal) to the first direction D1, with the system semiconductor package 100 interposed therebetween.

The system semiconductor package 100 may include a first package substrate 110, a first semiconductor chip 120, and a first mold layer 130. The first package substrate 110 may be, for example, a printed circuit board (PCB).

The first semiconductor chip 120 may be mounted on the first package substrate 110 in a flip-chip bonding manner. The first semiconductor chip 120 may be a system-on-chip (SOC), a logic chip, or an application processor (AP). The first semiconductor chip 120 may include circuits having different functions. For example, the first semiconductor chip 120 may include a logic circuit and a memory circuit. The first semiconductor chip 120 may further include at least one of a digital integrated circuit (IC), a wireless ultra-high or radio frequency integrated circuit (RFIC), and an input/output circuit.

First connection terminals 150 may be provided between the first package substrate 110 and the module substrate 700. The first connection terminals 150 may include solder balls, pillars, bumps, or a ball grid array.

The first mold layer 130 may be disposed on the first package substrate 110 to cover the first semiconductor chip 120. The first mold layer 130 may cover top and side surfaces of the first semiconductor chip 120, thereby hermetically sealing the first semiconductor chip 120. The first mold layer 130 may be formed of or include an insulating polymer (e.g., epoxy molding compound).

A first under-fill layer 160 may be provided to fill a gap region between the first package substrate 110 and the module substrate 700. The first under-fill layer 160 may be formed by a method of thermally compressing a non-conductive paste or a non-conductive film or a capillary under-fill process. A height of the system semiconductor package 100 mounted may be defined as a sum of heights of the first connection terminals 150, the first package substrate 110, and the first mold layer 130.

In the present specification, a height of an element may mean a largest length of the element measured in a direction perpendicular to the top surface 700a of the module substrate 700.

The first power management semiconductor package 200a may include a second package substrate 210a, a second semiconductor chip 220a, and a second mold layer 230a.

In an example embodiment, a redistribution layer or a printed circuit board may be used as the second package substrate 210a. In the case where the redistribution layer is used as the second package substrate 210a, the first power management semiconductor package 200a may be a panel-level fan-out package or a wafer-level fan-out package.

Second connection terminals 250a may be interposed between the module substrate 700 and the first power management semiconductor package 200a. The first power management semiconductor package 200a may be electrically connected to the module substrate 700 through the second connection terminals 250a. The second connection terminals 250a may include solder balls, pillars, bumps, or a ball grid array.

The second semiconductor chip 220a may include a first power management integrated circuit (PMIC) and may serve as a power management chip.

The second mold layer 230a may be provided on the second package substrate 210a to cover top and side surfaces of the second semiconductor chip 220a. In this case, a top surface of the first power management semiconductor package 200a may correspond to a top surface of the second mold layer 230a. In some example embodiments, the second mold layer 230a may be provided to cover the side surface of the second semiconductor chip 220a but expose the top surface of the second semiconductor chip 220a. In this case, the top surface of the first power management semiconductor package 200a may correspond to the top surface of the second mold layer 230a and the top surface of the second semiconductor chip 220a exposed by the second mold layer 230a. The second mold layer 230a may be formed of or include an insulating polymer (e.g., epoxy-based polymer). A second under-fill layer 260a may be provided to fill a gap region between the second package substrate 210a and the module substrate 700.

A height of the first power management semiconductor package 200a mounted may be defined as a sum of heights of the second connection terminals 250a, the second package substrate 210a, and the second mold layer 230a.

The second power management semiconductor package 200b may include a third package substrate 210b, a third semiconductor chip 220b, and a third mold layer 230b.

In an example embodiment, a redistribution layer or a printed circuit board may be used as the third package substrate 210b. In the case where the redistribution layer is used as the third package substrate 210b, the second power management semiconductor package 200b may be a panel-level fan-out package or a wafer-level fan-out package.

Third connection terminals 250b may be interposed between the module substrate 700 and the second power management semiconductor package 200b. The second power management semiconductor package 200b may be electrically connected to the module substrate 700 through the third connection terminals 250b. The third connection terminals 250b may include solder balls, pillars, bumps, or a ball grid array.

The third semiconductor chip 220b may include a second power management integrated circuit (PMIC) and may serve as a power management chip.

The third mold layer 230b may be provided on the third package substrate 210b to cover top and side surfaces of the third semiconductor chip 220b. In this case, a top surface of the second power management semiconductor package 200b may correspond to a top surface of the third mold layer 230b. In some example embodiments, the third mold layer 230b may be provided to cover the side surface of the third semiconductor chip 220b but expose the top surface of the third semiconductor chip 220b. In this case, the top surface of the second power management semiconductor package 200b may correspond to the top surface of the third mold layer 230b and the top surface of the third semiconductor chip 220b exposed by the third mold layer 230b. The third mold layer 230b may be formed of or include an insulating polymer (e.g., epoxy-based polymer). A third under-fill layer 260b may be provided to fill a gap region between the third package substrate 210b and the module substrate 700.

A height of the second power management semiconductor package 200b mounted may be defined as a sum of heights of the third connection terminals 250b, the third package substrate 210b, and the third mold layer 230b.

Each of the memory semiconductor packages 300 may include a fourth package substrate 310, a fourth semiconductor chip 320, and a fourth mold layer 330. In an example embodiment, a printed circuit board or a redistribution layer may be used as the fourth package substrate 310. The fourth semiconductor chip 320 may be a semiconductor chip, which is of a kind different from the first semiconductor chip 120, the second semiconductor chip 220a, and the third semiconductor chip 220b. For example, the fourth semiconductor chip 320 may serve as a memory chip. In an example embodiment, the memory chip may be or include a DRAM chip. In some example embodiments, the memory chip may be or include one of SRAM, MRAM, and NAND FLASH memory chips.

In the case where the fourth semiconductor chip 320 is mounted in a flip-chip bonding manner, an additional under-fill pattern may be provided to fill a gap region between the fourth package substrate 310 and the fourth semiconductor chip 320. The memory semiconductor package 300 may include a plurality of fourth semiconductor chips 320. In some example embodiments, the memory semiconductor package 300 may include just one fourth semiconductor chip 320.

Fourth connection terminals 350 may be interposed between the module substrate 700 and each of the memory semiconductor packages 300. Each of the memory semiconductor packages 300 may be electrically connected to the module substrate 700 through the fourth connection terminals 350. The fourth connection terminals 350 may include solder balls, pillars, bumps, or a ball grid array.

The fourth mold layer 330 may cover side and top surfaces of the fourth semiconductor chip 320, thereby sealing the fourth semiconductor chip 320. In this case, the top surface of the memory semiconductor package 300 may correspond to the top surface of the fourth mold layer 330. Unlike that illustrated in the drawings, the fourth mold layer 330 may be provided to cover the side surface of the fourth semiconductor chip 320 but expose the top surface of the fourth semiconductor chip 320. In this case, the top surface of the memory semiconductor package 300 may correspond to the top surface of the fourth mold layer 330 and the top surface of the fourth semiconductor chip 320 exposed by the fourth mold layer 330. The fourth mold layer 330 may be formed of or include an insulating polymer (e.g., epoxy-based polymer). A fourth under-fill layer 360 may be provided to fill a gap region between the fourth package substrate 310 and the module substrate 700. In certain embodiments, the fourth under-fill layer 360 may be omitted.

A height of each of the memory semiconductor packages 300 mounted may be defined as a sum of heights of the fourth connection terminals 350, the fourth package substrate 310, and the fourth mold layer 330.

In the following specification, the largest value of the heights of the system semiconductor package 100, the first power management semiconductor package 200a, the second power management semiconductor package 200b, and the memory semiconductor packages 300 may be referred to as the largest height H1 of the package structure. As an example, the height of the system semiconductor package 100 may be larger than all of the heights of the first power management semiconductor package 200a, the second power management semiconductor package 200b, and the memory semiconductor packages 300, and thus the height of the system semiconductor package 100 may be referred to as the largest height H1 of the package structure.

First upper passive devices 410 may be mounted on the top surface 700a of the module substrate 700. The first upper passive device 410 may be an input capacitor, which is electrically connected to the first power management semiconductor package 200a. When viewed in a plan view, the first upper passive devices 410 may be provided to surround the first power management semiconductor package 200a. Some of the first upper passive devices 410 may be arranged in the second direction D2 between the first power management semiconductor package 200a and the system semiconductor package 100 and may be closer to the first power management semiconductor package 200a than to the system semiconductor package 100.

Second upper passive devices 420 may be mounted on the top surface 700a of the module substrate 700. At least one of the second upper passive devices 420 may be an input capacitor, which is electrically connected to the second power management semiconductor package 200b.

When viewed in a plan view, the second upper passive devices 420 may be provided to surround the second power management semiconductor package 200b. Some of the second upper passive devices 420 may be arranged in the second direction D2 between the second power management semiconductor package 200b and the system semiconductor package 100 and may be closer to the second power management semiconductor package 200b than to the system semiconductor package 100.

The number of the first upper passive devices 410 may be greater than the number of the second upper passive devices 420.

The largest value H2 of the heights of the first and second upper passive devices 410 and 420 mounted may be smaller than the largest height H1 of the package structure.

First and second electronic devices 510 and 520 may be mounted on the top surface 700a of the module substrate 700. The first and second electronic devices 510 and 520 may include an oscillator (e.g., a crystal oscillator) or a real-time clock.

The first electronic device 510 may be spaced apart from the first power management semiconductor package 200a with some of the first upper passive devices 410 interposed therebetween. A capacitor 510C, which is electrically connected to the first electronic device 510, may be provided near the first electronic device 510, and in an example embodiment, the capacitor 510C may be mounted on the top surface 700a of the module substrate 700.

The second electronic device 520 may be spaced apart from the second power management semiconductor package 200b with some of the second upper passive devices 420 interposed therebetween. A capacitor 520C, which is electrically connected to the second electronic device 520, may be provided near the second electronic device 520, and in an example embodiment, the capacitor 520C may be mounted on the top surface 700a of the module substrate 700.

The largest value H3 of the heights of the first and second electronic devices 510 and 520 mounted may be smaller than the largest height H1 of the package structure.

A heat-dissipation structure 610 may be provided on the system semiconductor package 100, the first and second power management semiconductor packages 200a and 200b, the memory semiconductor packages 300, the first and second upper passive devices 410 and 420, and the first and second electronic devices 510 and 520. The heat-dissipation structure 610 may be, for example, a heat sink. The heat-dissipation structure 610 may be formed of or include a material having a good thermal conductivity property. For example, the heat-dissipation structure 610 may be formed of or include a metallic material. The heat-dissipation structure 610 may have a flat shape and may be provided to be parallel to the first and second directions D1 and D2.

A first heat transfer layer 810 may be interposed between the system semiconductor package 100 and the heat-dissipation structure 610 and may be in physical contact with the top surface of the system semiconductor package 100 and the bottom surface of the heat-dissipation structure 610.

A second heat transfer layer 820 may be provided between the first power management semiconductor package 200a and the heat-dissipation structure 610 and may be in physical contact with the top surface of the first power management semiconductor package 200a and the bottom surface of the heat-dissipation structure 610.

A third heat transfer layer 830 may be provided between the second power management semiconductor package 200b and the heat-dissipation structure 610 and may be in physical contact with the top surface of the second power management semiconductor package 200b and the bottom surface of the heat-dissipation structure 610.

A fourth heat transfer layer 840 may be provided between each of the memory semiconductor packages 300 and the heat-dissipation structure 610. The fourth heat transfer layer 840 may be in physical contact with the top surface of the memory semiconductor package 300 and the bottom surface of the heat-dissipation structure 610.

The first to fourth heat transfer layers 810, 820, 830, and 840 may include, for example, a thermal interface material (TIM).

Although not shown, dam structures may be further provided on the top surface 700a of the module substrate 700. The dam structures may be provided to surround the under-fill layers 160, 260a, 260b, and 360.

First passive devices 430, first lower passive devices 432, second lower passive devices 434, and second passive devices 436 may be mounted on a bottom surface 1000b of the system board 1000.

Each of the first passive devices 430 may be one of a resistor and a capacitor. Each of the second passive devices 436 may be one of a resistor and a capacitor. The first passive devices 430 may be electrically connected to the system semiconductor package 100 through the system board 1000 and the module substrate 700. At least a portion of the first passive devices 430 may be vertically overlapped with the system semiconductor package 100, when viewed in a plan view. The second passive devices 436 may be electrically connected to the memory semiconductor packages 300 through the system board 1000 and the module substrate 700. At least a portion of the second passive devices 436 may be vertically overlapped with the memory semiconductor package 300, when viewed in a plan view The first lower passive devices 432 may be electrically connected to the first power management semiconductor package 200a through the system board 1000 and the module substrate 700. Each of the first lower passive devices 432 may be one of a resistor, an output capacitor, and an inductor. The first lower passive devices 432 may include a plurality of passive devices 432a and 432b having different sizes.

As an example, the passive device 432b may have a relatively large size and may be an inductor, and the passive device 432a may have a relatively small size and may be an output capacitor. Some of the passive devices 432a (e.g., the output capacitors) may be disposed between adjacent ones of the passive devices 432b (i.e., the inductors). Some of the passive devices 432a (e.g., the output capacitors) may be disposed to enclose the passive devices 432b (i.e., the inductors).

At least one of the first lower passive devices 432 may be overlapped with the first power management semiconductor package 200a, when viewed in a plan view.

The second lower passive devices 434 may be electrically connected to the second power management semiconductor package 200b through the system board 1000 and the module substrate 700. Each of the second lower passive devices 434 may be one of a resistor, an output capacitor, and an inductor. The second lower passive devices 434 may include a plurality of passive devices 434a and 434b having different sizes.

As an example, the passive device 434b may have a relatively large size and may be an inductor, and the passive device 434a may have a relatively small size and may be an output capacitor. Some of the passive devices 434a (e.g., the output capacitors) may be disposed between adjacent ones of the passive devices 434b (i.e., the inductors). Some of the passive devices 434a (e.g., the output capacitors) may be disposed to enclose the passive devices 434b (i.e., the inductors). At least one of the second lower passive devices 434 may be vertically overlapped with the second power management semiconductor package 200b, when viewed in a plan view.

Each of the first passive devices 430, the first lower passive devices 432, the second lower passive devices 434, and the second passive devices 436 may be vertically overlapped with the semiconductor packages 100, 200a, 200b, and 300, respectively, which are placed on the module substrate 700, and thus, it may be possible to reduce lengths of wires, which are provided in the module substrate 700 and the system board 1000 to electrically connect them.

The first passive devices 430, the first lower passive devices 432, the second lower passive devices 434, and the second passive devices 436 may have the same height or may have different heights. The largest height H4 of the heights of the first passive devices 430, the first lower passive devices 432, the second lower passive devices 434, and the second passive devices 436 may be greater than the largest height H1 of the package structure.

Figure 2A:
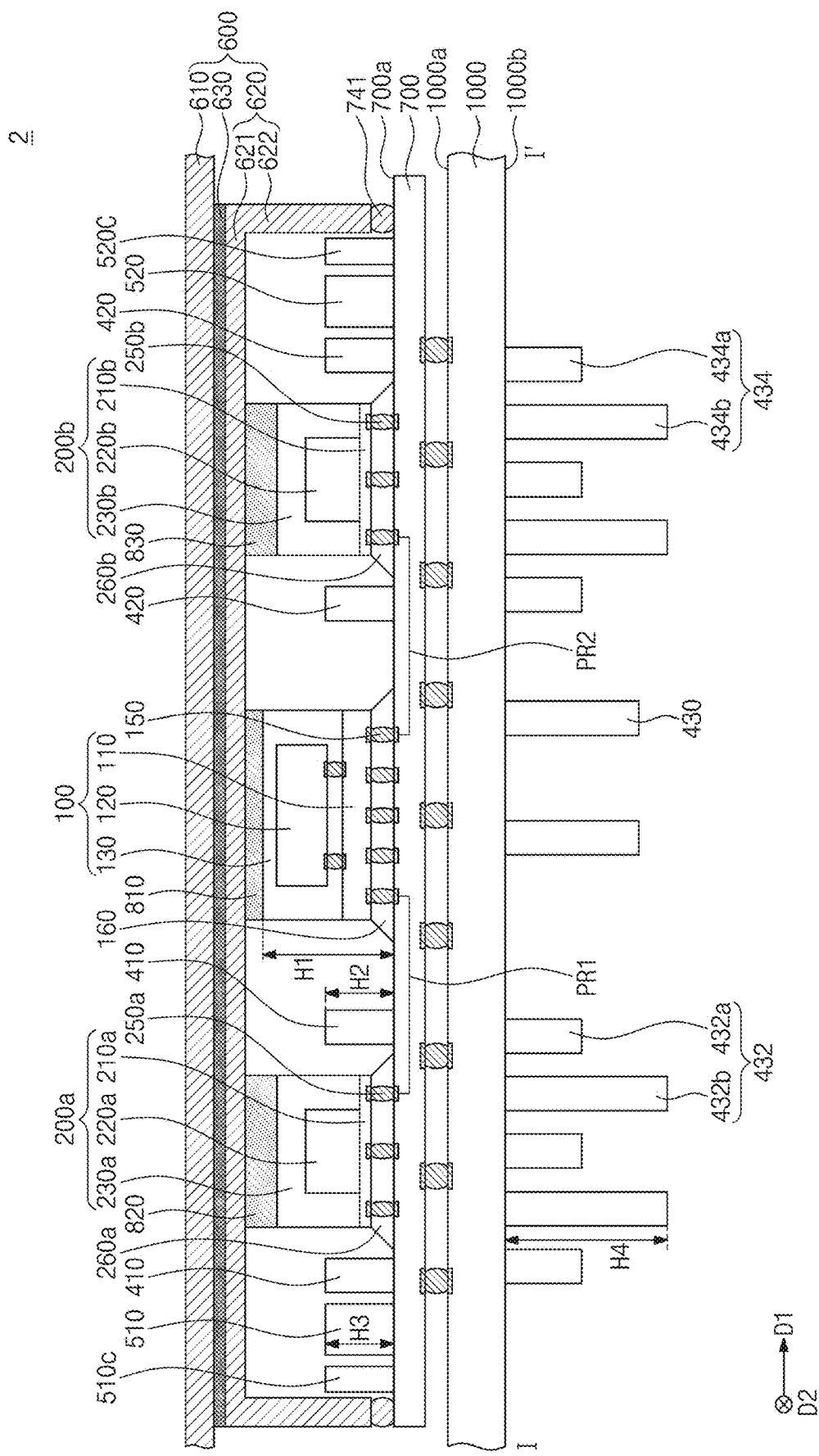
FIG. 2A is a sectional view taken along line I-I' of FIG. 1A.
Figure 2B:
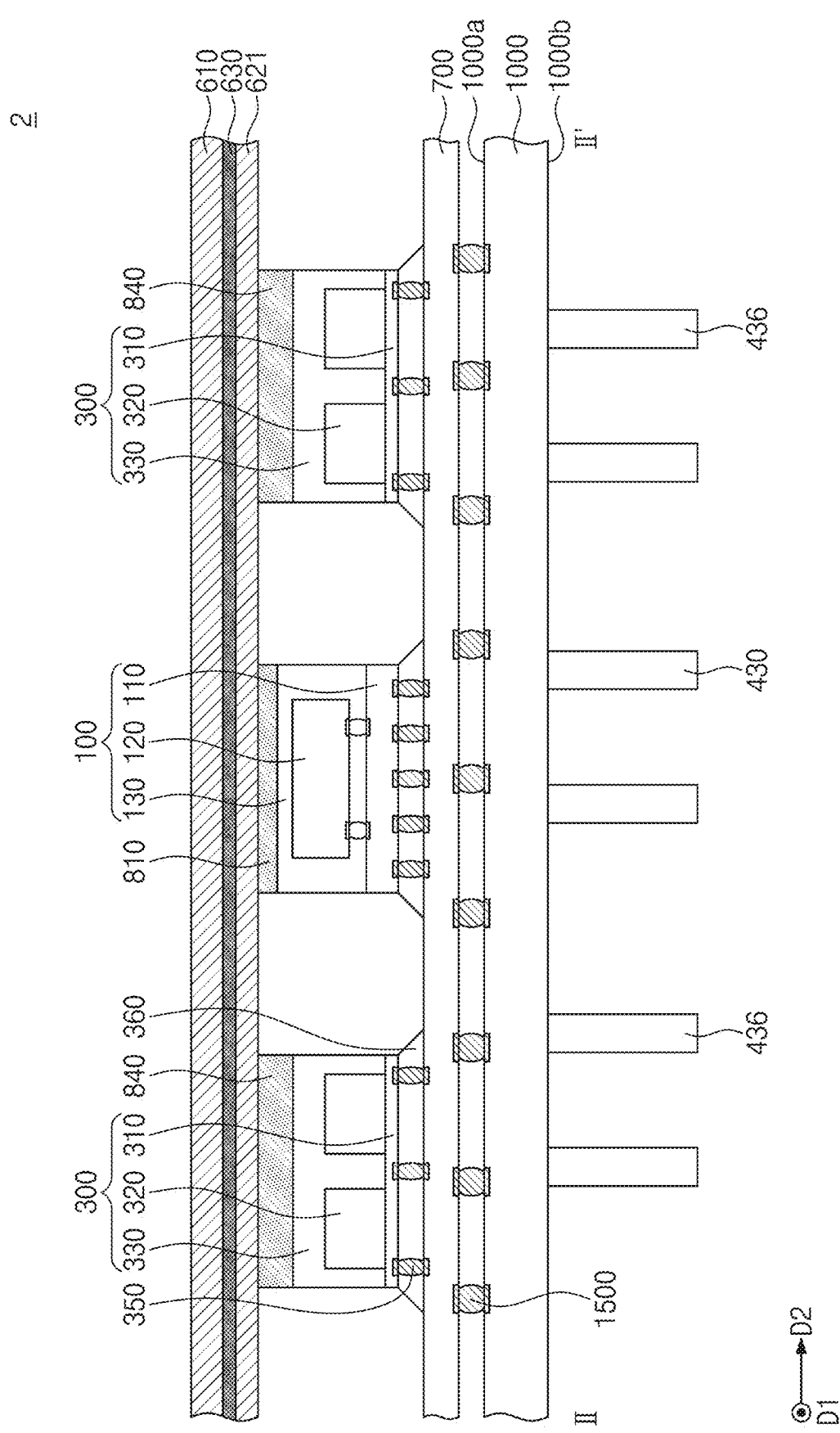
FIG. 2B is a sectional view taken along line II-II' of FIG. 1A.

FIG. 2A is a sectional view of a semiconductor module 2 according to an example embodiment of the inventive concepts, which corresponds to that taken along line I-I' of FIG. 1A. FIG. 2B corresponds to a sectional view taken along line II-II' of FIG. 1A. For concise description, an element previously described with reference to FIGS. 1B and 1C will be identified by the same reference number without repeating an overlapping description thereof.

Referring to FIGS. 2A and 2B, the semiconductor module 2 may include a heat-dissipation structure 600. The heat-dissipation structure 600 may include a first heat-dissipation structure 610, a second heat-dissipation structure 620, and a heat-dissipation layer 630 therebetween.

The heat-dissipation structure 600 may be provided on the system semiconductor package 100, the first power management semiconductor package 200a, the second power management semiconductor package 200b, the memory semiconductor packages 300, and the first and second upper passive devices 410 and 420.

The first heat-dissipation structure 610 may be spaced apart from the module substrate 700. The heat-dissipation layer 630 may be formed of or include, for example, a thermal interface material (TIM).

The second heat-dissipation structure 620 may include a body portion 621 and a leg portion 622. The body portion 621 of the second heat-dissipation structure 620 may be similar to the first heat-dissipation structure 610. The leg portion 622 of the second heat-dissipation structure 620 may be provided between an edge region of the body portion 621 and the module substrate 700. The second heat-dissipation structure 620 may have a thermally conductive property. The second heat-dissipation structure 620 may have an electrically conductive property, and in this case, it may be possible to suppress an electromagnetic interference (EMI) issue between the semiconductor packages 100, 200a, 200b, and 300. Adhesive patterns 741 may be provided between the module substrate 700 and the leg portion 622 of the second heat-dissipation structure 620 to fasten the second heat-dissipation structure 620 to the module substrate 700.

Figure 3A:
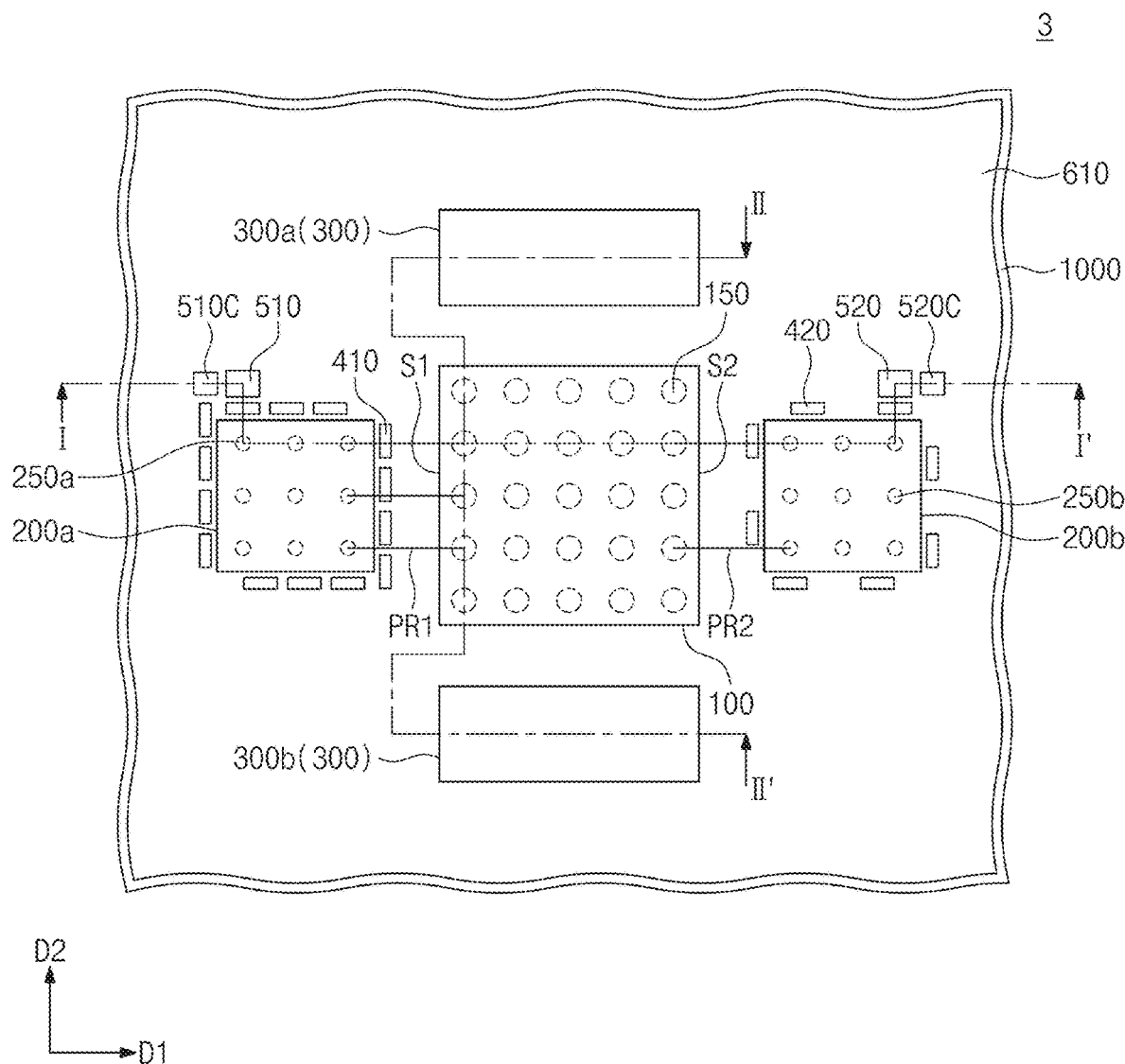
FIG. 3A is a plan view illustrating a semiconductor module according to an example embodiment of the inventive concepts.
Figure 3B:
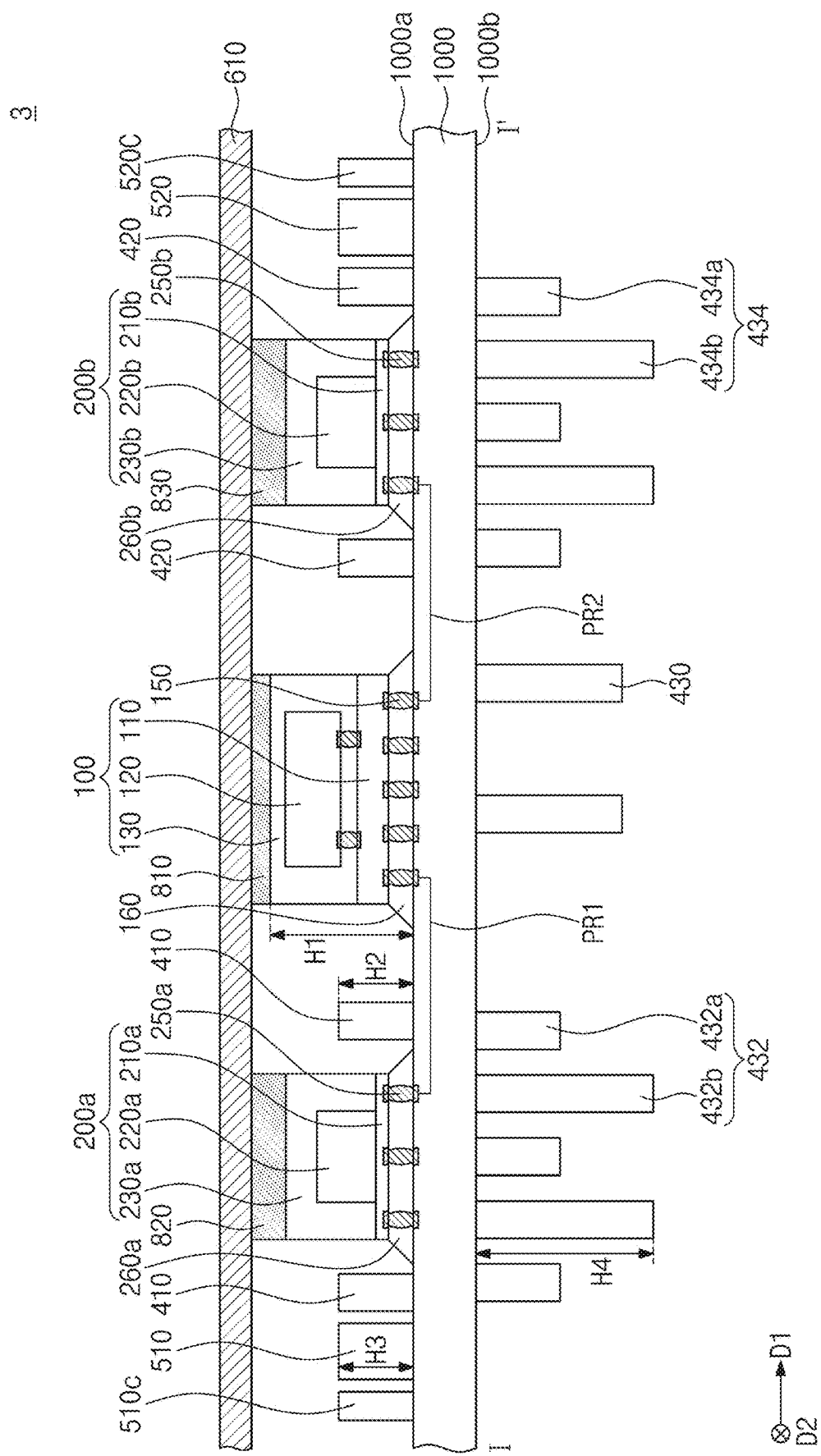
FIG. 3B is a sectional view taken along line I-I' of FIG. 3A.
Figure 3C:
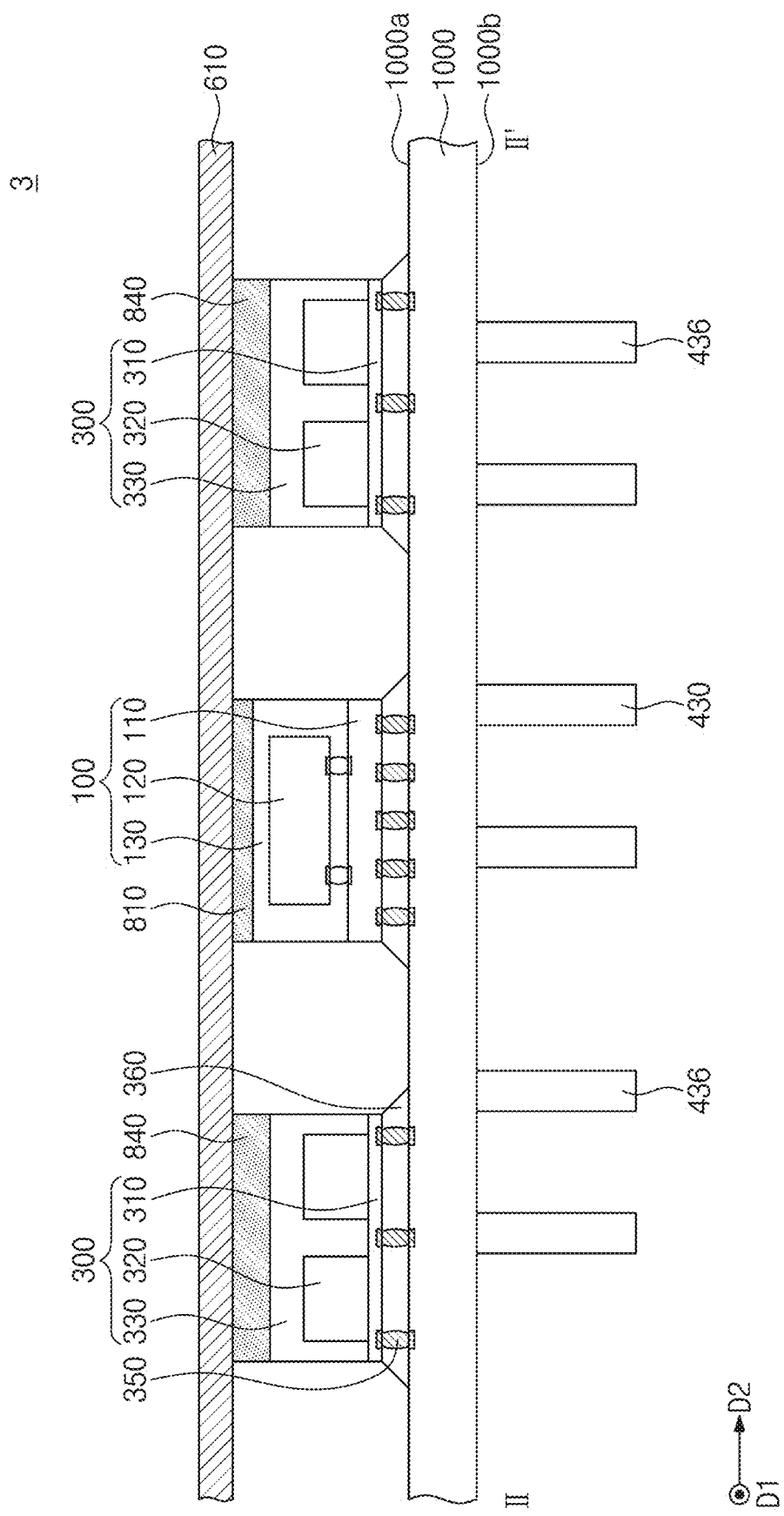
FIG. 3C is a sectional view taken along line II-II' of FIG. 3A.

FIG. 3A is a plan view illustrating a semiconductor module 3 according to an example embodiment of the inventive concepts. FIG. 3B is a sectional view taken along line I-I' of FIG. 3A. FIG. 3C is a sectional view taken along line II-II' of FIG. 3A.

Referring to FIGS. 3A and 3B, the module substrate 700 of FIGS. 1B and 1C may be omitted from the semiconductor module 3.

The system semiconductor package 100, the first and second power management semiconductor packages 200a and 200b, and the memory semiconductor packages 300 may be mounted on the top surface 1000a of the system board 1000.

In detail, the first connection terminals 150 may be in contact with some of pads, which are disposed under the system semiconductor package 100 and on the system board 1000. The second connection terminals 250a may be in contact with some of pads, which are disposed under the first power management semiconductor package 200a and on the system board 1000. The third connection terminals 250b may be in contact with some of pads, which are disposed under the second power management semiconductor package 200b and on the system board 1000. The fourth connection terminals 350 may be in contact with some of pads, which are disposed under the memory semiconductor package 300 and on the system board 1000.

The first and second upper passive devices 410 and 420 and the first and second electronic devices 510 and 520 may be mounted on the top surface 1000a of the system board 1000. The capacitors 510C and 520C, which are respectively connected to the first and second electronic devices 510 and 520, may be mounted on the top surface 1000a of the system board 1000.

Figure 4:
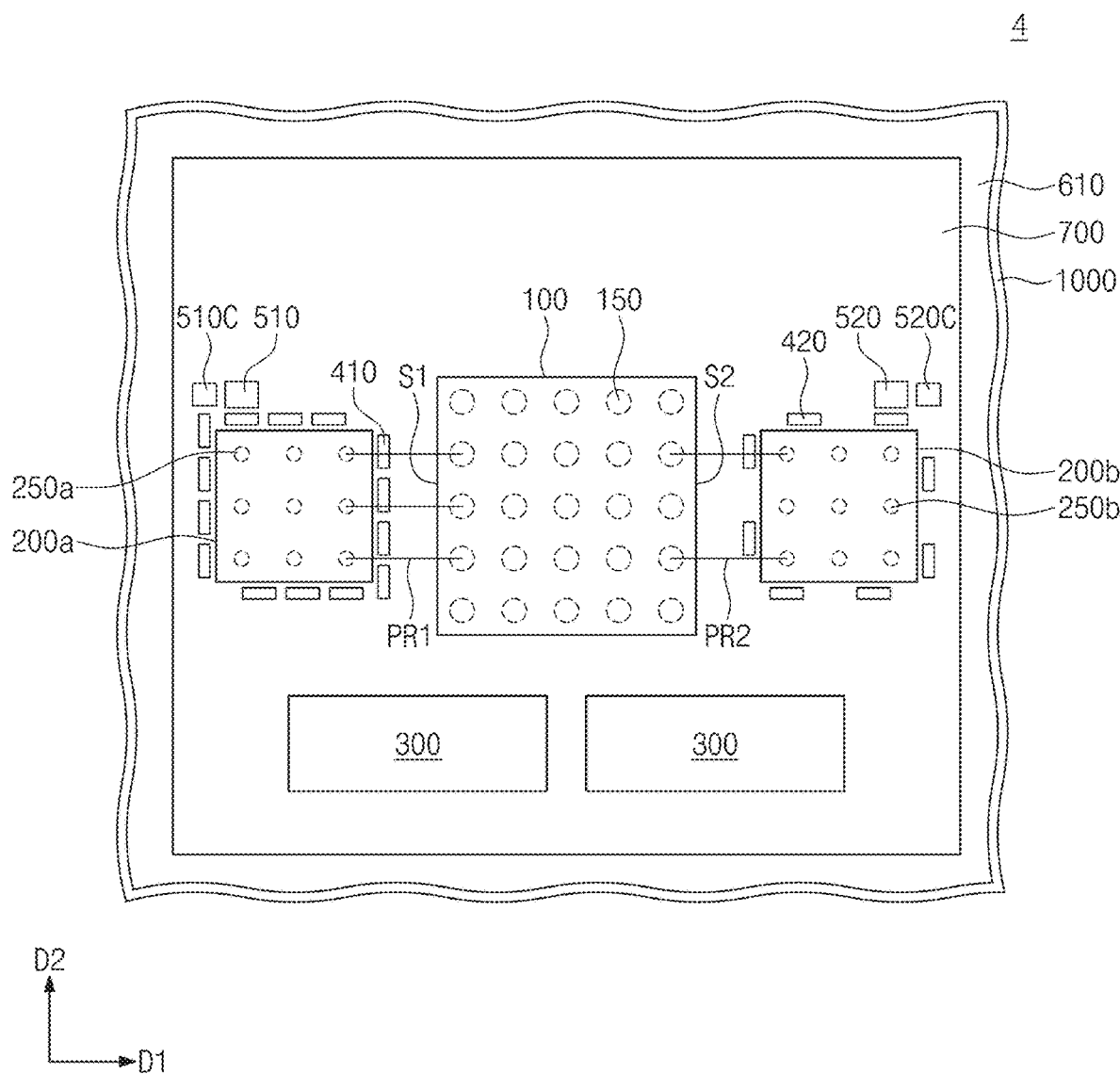
FIG. 4 is a plan view illustrating a semiconductor module according to an example embodiment of the inventive concepts.

FIG. 4 is a plan view illustrating a semiconductor module 4 according to an example embodiment of the inventive concepts. For concise description, an element previously described with reference to FIG. 1A will be identified by the same reference number without repeating an overlapping description thereof.

The memory semiconductor packages 300 may be spaced apart from each other in the first direction D1. The memory semiconductor packages 300 may be arranged along one side edge of the system semiconductor package 100 and may be disposed to face each other. The memory semiconductor packages 300 may be disposed, such that the system semiconductor package 100 is not disposed therebetween, unlike that shown in FIG. 1A.

Figure 5:
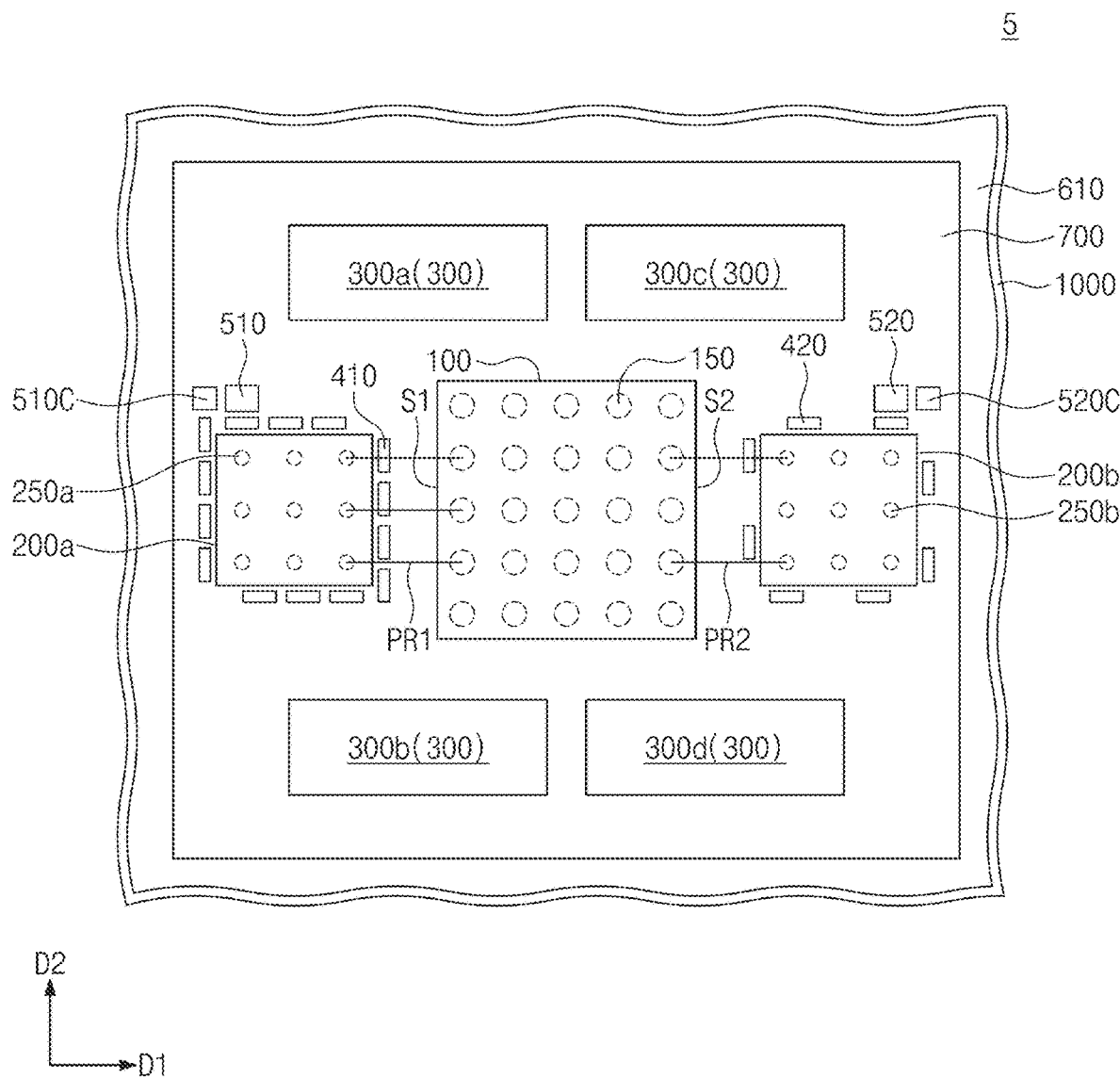
FIG. 5 is a plan view illustrating a semiconductor module according to an example embodiment of the inventive concepts.

FIG. 5 is a plan view illustrating a semiconductor module 5 according to an example embodiment of the inventive concepts. For concise description, an element previously described with reference to FIG. 1A will be identified by the same reference number without repeating an overlapping description thereof.

Referring to FIG. 5, the semiconductor module 5 may further include a third memory semiconductor package 300c and a fourth memory semiconductor package 300d, which are spaced apart from each other in the second direction D2 with the system semiconductor package 100 interposed therebetween. The third memory semiconductor package 300c may be spaced apart from the first memory semiconductor package 300a in the first direction D1. The fourth memory semiconductor package 300d may be spaced apart from the second memory semiconductor package 300b in the first direction D1.

Figure 6A:
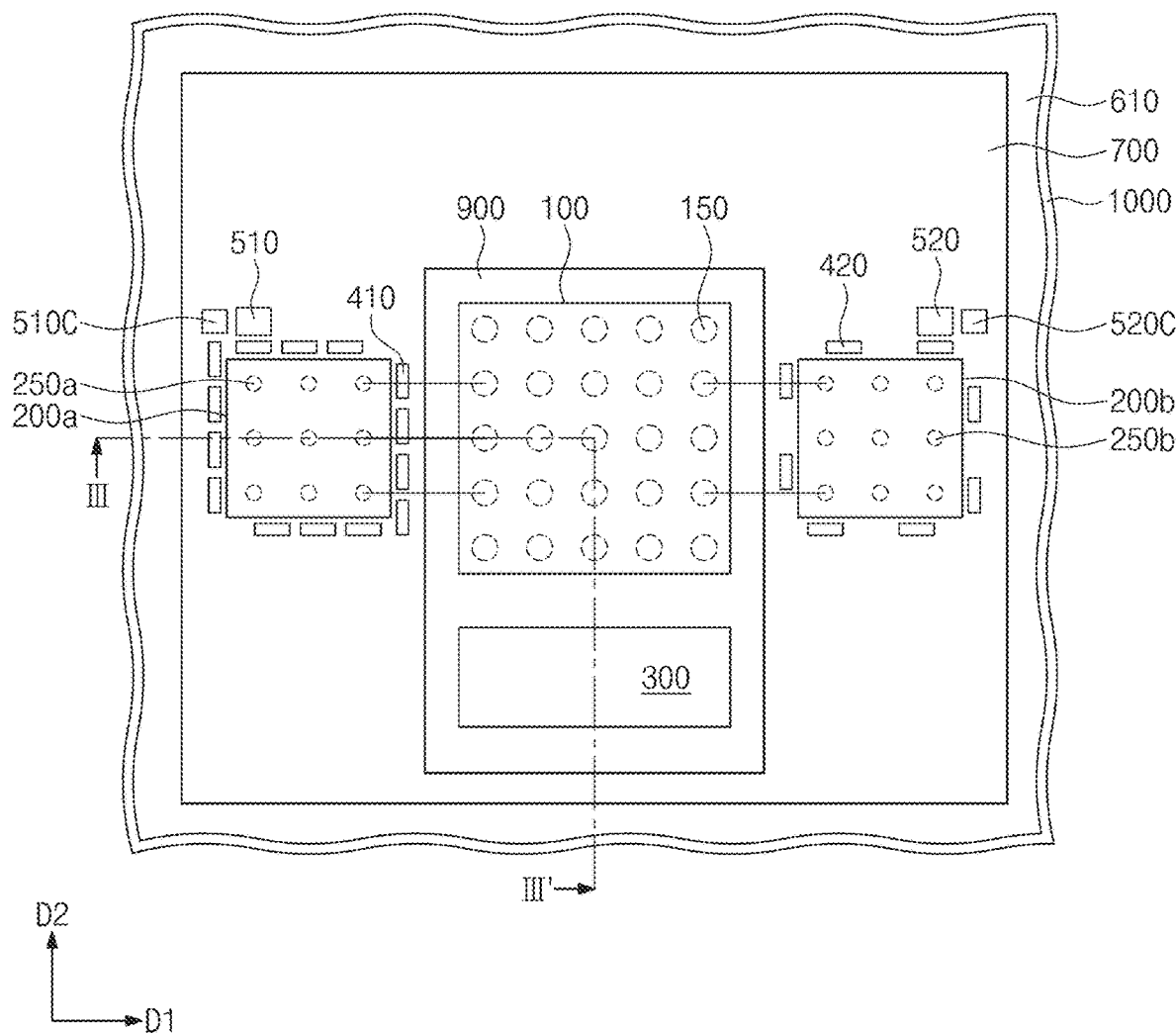
FIG. 6A is a plan view illustrating a semiconductor module according to an example embodiment of the inventive concepts.

FIG. 6A is a plan view illustrating a semiconductor module 6 according to an example embodiment of the inventive concepts. FIG. 6B is a sectional view taken along line III-III' of FIG. 6A. For concise description, an element previously described with reference to FIGS. 1A, 1B, and 1C will be identified by the same reference number without repeating an overlapping description thereof.

The first and second power management semiconductor packages 200a and 200b and an interposer 900 may be provided on the top surface 700a of the module substrate 700. The interposer 900 may be disposed between the first power management semiconductor package 200a and the second power management semiconductor package 200b, and may be electrically connected to the module substrate 700 through connect terminals 950 disposed therebetween.

The first semiconductor chip 120 and a memory semiconductor structure MS may be mounted on the interposer 900. The first semiconductor chip 120 may be electrically connected to the interposer 900 through the first connection terminals 150.

The memory semiconductor structure MS may include a stack of the fourth semiconductor chips 320 and a plurality of through vias TSV penetrating each of the fourth semiconductor chips 320. The fourth semiconductor chips 320 may be electrically connected to each other via the through vias TSV. The memory semiconductor structure MS may be electrically connected to the interposer 900 through the connection terminals 350, which are provided thereunder.

Figure 7A:
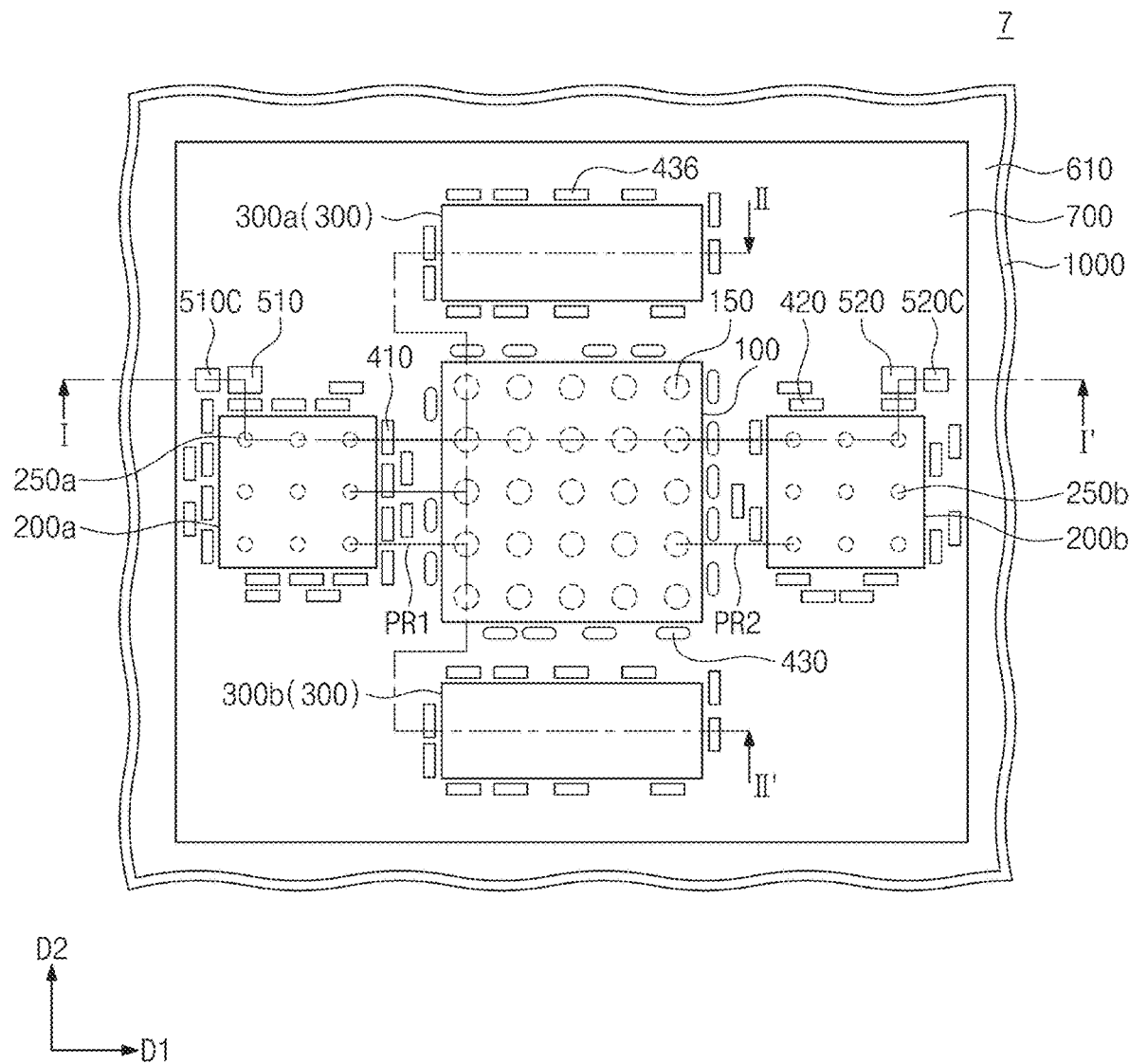
FIG. 7A is a plan view illustrating a semiconductor module according to an example embodiment of the inventive concepts.
Figure 7B:
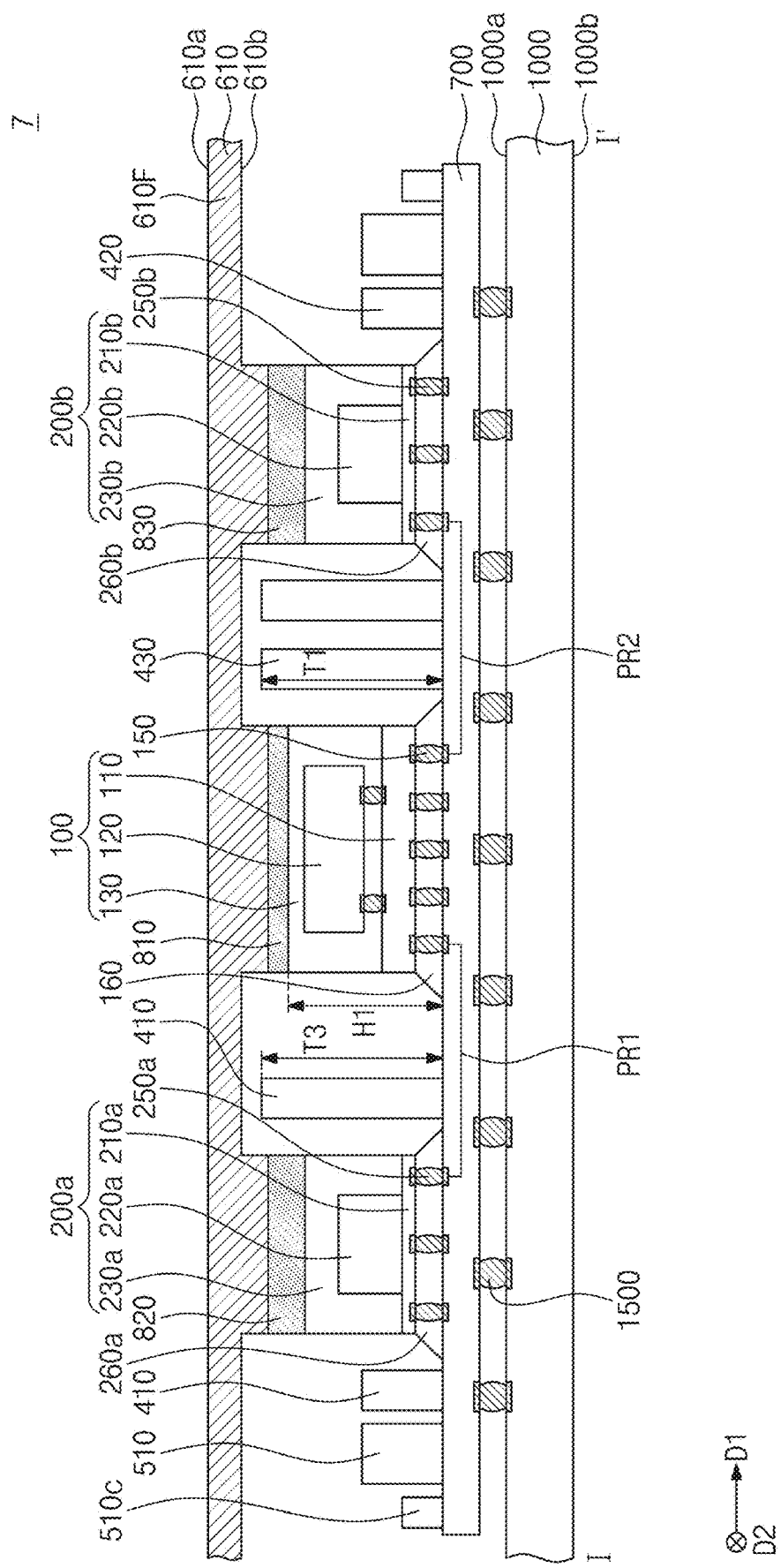
FIG. 7B is a sectional view taken along line I-I' of FIG. 7A.
Figure 7C:
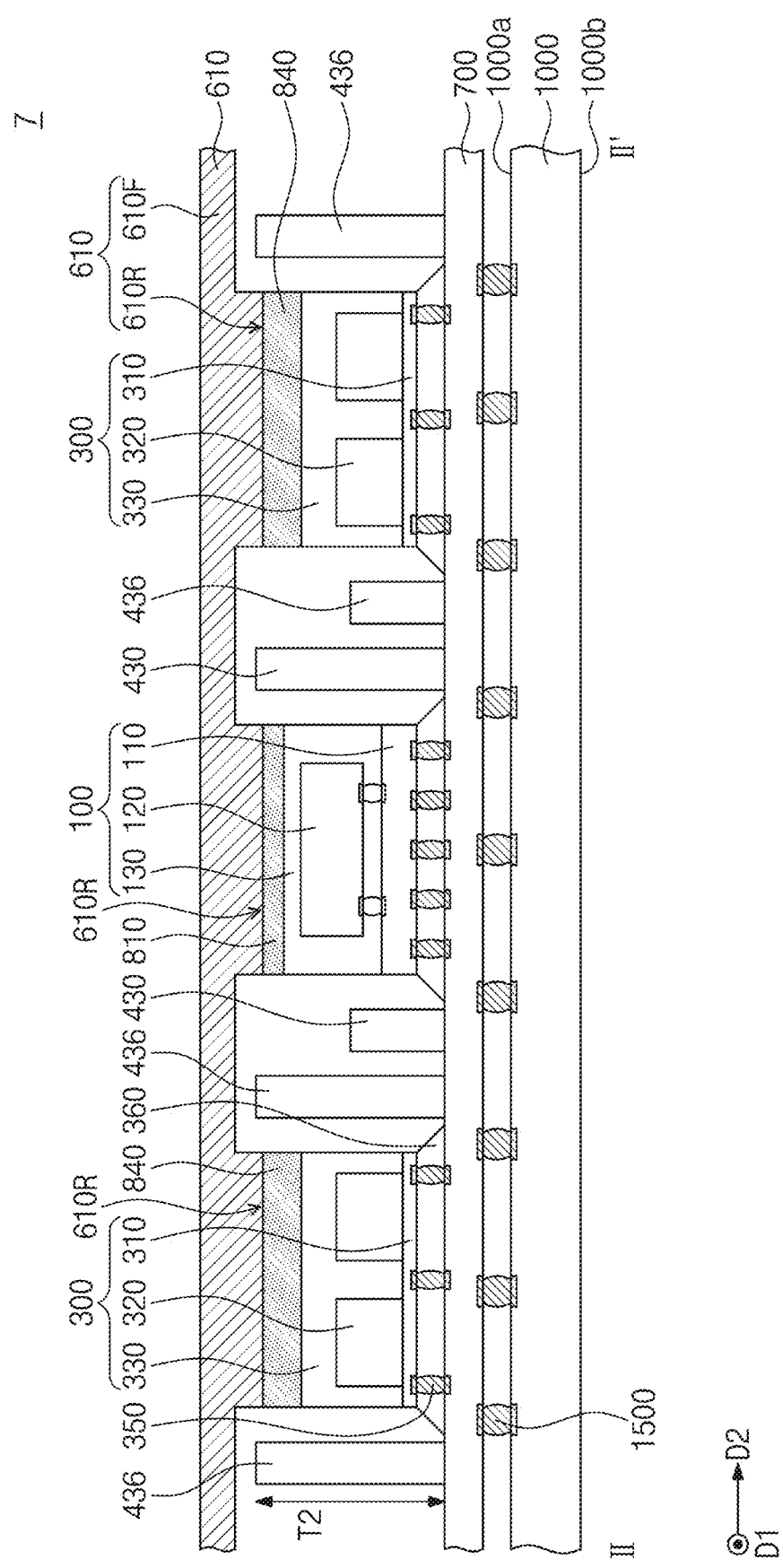
FIG. 7C is a sectional view taken along line II-II' of FIG. 7A.

FIG. 7A is a plan view illustrating a semiconductor module 7 according to an example embodiment of the inventive concepts. FIG. 7B is a sectional view taken along line I-I' of FIG. 7A. FIG. 7C is a sectional view taken along line II-II' of FIG. 7A. For concise description, an element previously described with reference to FIGS. 1B and 1C will be identified by the same reference number without repeating an overlapping description thereof.

Referring to FIGS. 7A, 7B, and 7C, any passive device may not be disposed on a bottom surface of the system board 1000.

The first passive devices 430, which are electrically connected to the system semiconductor package 100, may be placed on the top surface 700a of the module substrate 700. Each of the first passive devices 430 may be one of a resistor, a capacitor, and an inductor. The first passive devices 430 may be provided to enclose the system semiconductor package 100, when viewed in a plan view. At least one of the first passive devices 430 may have a height T1 larger than the largest height H1 of the package structure.

The second passive devices 436, which are electrically connected to the memory semiconductor packages 300, may be placed on the top surface 700a of the module substrate 700. Each of the second passive devices 436 may be one of a resistor, a capacitor, and an inductor. The second passive devices 436 may be provided to enclose the memory semiconductor packages 300, when viewed in a plan view. At least one of the second passive devices 436 may have a height T2 larger than the largest height H1 of the package structure.

Third passive devices 410 and fourth passive devices 420, which are electrically connected to the first power management semiconductor package 200a and the second power management semiconductor package 200b, respectively, may be placed on the top surface 700a of the module substrate 700. The third passive devices 410 and the fourth passive devices 420 may include a resistor, a capacitor, and an inductor. The capacitor may include an input capacitor and an output capacitor. The third passive devices 410 and the fourth passive devices 420 may be provided to enclose the first power management semiconductor package 200a and the second power management semiconductor package 200b, respectively, when viewed in a plan view. At least one of the third and fourth passive devices 410 and 420 may have a height T3 larger than the largest height H1 of the package structure.

The heat-dissipation structure 610 may have a flat top surface 610a and an uneven bottom surface 610b. For example, the heat-dissipation structure 610 may include a body portion 610F, which is flat in the first and second directions D1 and D2, and extended portions 610R, which is extended from the body portion 610F toward the module substrate 700. The extended and body portions 610R and 610F may have bottom surfaces, which are located at different vertical levels.

The bottom surface 610b of the heat-dissipation structure 610 may not be in contact with the first to fourth passive devices 430, 436, 410, and 420 and may be in contact with the first to fourth heat transfer layers 810, 820, 830 and 840. The first to fourth heat transfer layers 810, 820, 830 and 840 may be in contact with the extended portions 610R of the heat-dissipation structure 610. The first to fourth passive devices 430, 436, 410, and 420 may be spaced apart from the body portion 610F in the vertical direction.

In the case where a single power management semiconductor package is used, wires, which are used to supply an electric power to the system semiconductor package, may be densely connected to the single power management semiconductor package, and in this case, the power management semiconductor package should have a sufficiently large size.

As the demand for a system semiconductor chip with improved performance and functions increases, a number of wires, which are used to supply an electric power to the system semiconductor package and the size of the power management semiconductor package are increasing. This increase in size of the power management semiconductor package may lead to a reduction in fabrication yield.

According to an example embodiment of the inventive concepts, a pair of power management semiconductor packages supplies electric power to the system semiconductor package. Accordingly, it may be possible to reduce a size of each power management semiconductor package and to improve the fabrication yield of the power management semiconductor packages.

In addition, the supply of the electric power may be achieved by using short wires, compared with the case of using a single power management semiconductor package, and thus, it may be possible to more stably supply the electric power to the system semiconductor package.

According to an example embodiment of the inventive concepts, it may be possible to stably control an electric power, which is supplied from a power management semiconductor package to a system semiconductor package during an operation of a semiconductor module.

While example embodiments of the inventive concepts have been particularly shown and described with reference to some example embodiments thereof, it will be understood by one of ordinary skill in the art that variations in form and detail may be made therein without departing from the spirit and scope of the claims.

What is claimed is:

1. A semiconductor module, comprising:
a system board including a top surface and a bottom surface;
a module substrate on the top surface of the system board;
a system semiconductor package on the module substrate; and
a pair of power management semiconductor packages on the module substrate, the pair of power management semiconductor packages configured to power the system semiconductor package, the pair of power management semiconductor packages including a first power management semiconductor package and a second power management semiconductor package spaced apart from the first power management semiconductor package in a first direction with the system semiconductor package therebetween, the first direction being parallel to a top surface of the module substrate.

2. The semiconductor module of claim 1, wherein the module substrate comprises:
a plurality of first wires electrically connecting the system semiconductor package to the first power management semiconductor package; and
a plurality of second wires electrically connecting the system semiconductor package to the second power management semiconductor package,
wherein a number of the plurality of first wires is different from a number of the plurality of second wires.

3. The semiconductor module of claim 1, further comprising:
a first pair of memory semiconductor packages on the module substrate with the system semiconductor package therebetween.

4. The semiconductor module of claim 3, wherein the first pair of memory semiconductor packages are spaced apart from each other in a second direction, the second direction being parallel to the top surface of the module substrate and crossing the first direction.

5. The semiconductor module of claim 3, further comprising:
upper passive devices on the top surface of the module substrate; and
lower passive devices on the bottom surface of the system board.

6. The semiconductor module of claim 5, wherein heights of each of the upper passive devices from the top surface of the module substrate are less than a height of a largest one of the system semiconductor package, the first and second power management semiconductor packages, and the first pair of memory semiconductor packages.

7. The semiconductor module of claim 5, wherein a height of at least one of the lower passive devices from the bottom surface of the system board is greater than a height of a largest one of the system semiconductor package, the first and second power management semiconductor packages, and the first pair of memory semiconductor packages from the top surface of the module substrate.

8. The semiconductor module of claim 5, wherein the upper passive devices comprise:
first upper passive devices configured to enclose the first power management semiconductor package, when viewed in a plan view, and
second upper passive devices configured to enclose the second power management semiconductor package, when viewed in a plan view.

9. The semiconductor module of claim 8, further comprising:
a pair of electronic devices on the module substrate, the pair of electronic devices including,
a first electronic device spaced apart from the first power management semiconductor package with some of the first upper passive devices therebetween, and
a second electronic device spaced apart from the second power management semiconductor package with some of the second upper passive devices therebetween, wherein
the first electronic device and the second electronic device each are a crystal oscillator or a real-time clock.

10. The semiconductor module of claim 5, wherein the lower passive devices comprise:
first lower passive devices, at least one of the first lower passive devices vertically overlapping with the first power management semiconductor package when viewed in a plan view, and
second lower passive devices, at least one of the second lower passive devices vertically overlapped with the second power management semiconductor package when viewed in a plan view.

11. The semiconductor module of claim 3, further comprising:
first passive devices, second passive devices, third passive devices, and fourth passive devices on the top surface of the module substrate; and
a heat-dissipation structure on the module substrate, the heat-dissipation structure is spaced apart from the first, second, third and fourth passive devices in a vertical direction, the heat-dissipation structure including a flat top surface and an uneven bottom surface,
wherein the first passive devices are enclosed the system semiconductor package, wherein the second passive devices are enclosed in a first pair of memory semiconductor packages, wherein the third passive devices and the fourth passive devices are enclosed in the first power management semiconductor package and the second power management semiconductor package respectively, wherein a height of at least one of the first, second, third and fourth passive devices from the top surface of the module substrate is greater than a height of a largest one of the system semiconductor package, the first and second power management semiconductor packages, and the first pair of memory semiconductor packages.

12. The semiconductor module of claim 4, further comprising:
a second pair of memory semiconductor packages on the module substrate with the system semiconductor package therebetween.

13. A semiconductor module, comprising:
a system board;
a system semiconductor package on the system board, the system semiconductor package including a system-on-chip;
a pair of power management semiconductor packages on the system board, the pair of power management semiconductor packages configured to power the system semiconductor package, the pair of power management semiconductor packages including a first power management semiconductor package and a second power management semiconductor package;
first wires disposed across a first side surface of the system semiconductor package, when viewed in a plan view, the first power management semiconductor package being electrically connected to the system semiconductor package via the first wires; and
second wires disposed across a second side surface of the system semiconductor package, the second power management semiconductor package being electrically connected to the system semiconductor package via the second wires, the second side surface being opposite to the first side surface, wherein
the first wires and the second wires extend in different directions from the system semiconductor package.

14. The semiconductor module of claim 13, wherein the pair of power management semiconductor packages are configured to power the system semiconductor package by supplying a first amount of power to the system semiconductor package via the first power management semiconductor package and supplying a second amount of power to the system semiconductor package via the second power management semiconductor package, the second amount of power being different than the first amount of power.

15. The semiconductor module of claim 13, further comprising:

first connection terminals in contact with respective pads on the system board and respective pads under the system semiconductor package;
second connection terminals in contact with respective pads on the system board and respective pads under the first power management semiconductor package; and
third connection terminals in contact with respective pads on the system board and respective pads under the second power management semiconductor package.

16. The semiconductor module of claim 15, further comprising:
a first pair of memory semiconductor packages on the system board with the system semiconductor package therebetween, the first pair of memory semiconductor packages each including fourth connection terminals in contact with respective pads provided thereunder and with respective pads on the system board.

17. The semiconductor module of claim 16, further comprising:
upper passive devices on a top surface of the system board; and
lower passive devices on a bottom surface of the system board.

18. The semiconductor module of claim 17, wherein heights of each of the upper passive devices from the top surface of the system board are less than a height of a largest one of the system semiconductor package, the pair of power management semiconductor packages, and the first pair of memory semiconductor packages.

19. The semiconductor module of claim 18, wherein heights of the lower passive devices from the bottom surface of the system board are greater than a height of largest one of the system semiconductor package, the pair of power management semiconductor packages, and the first pair of memory semiconductor packages from the top surface of the system board.

20. A semiconductor module, comprising:
a system board;
a module substrate on the system board;
a pair of power management semiconductor packages on a top surface of the module substrate, the pair of power management semiconductor packages being spaced apart in a first direction parallel to the top surface of the module substrate;
an interposer between the pair of power management semiconductor packages; and
a system-on-chip and a memory chip stack on the interposer, the system-on-chip being between the pair of power management semiconductor packages, when viewed in a plan view, the system-on-chip being powered via the pair of power management semiconductor packages.

* * * * *